United States Patent [19]

Stone

[11] 4,101,805
[45] Jul. 18, 1978

[54] TOUCH-RESPONSIVE SOCKET

[75] Inventor: David E. Stone, Houston, Tex.

[73] Assignee: Destron, Inc., Houston, Tex.

[21] Appl. No.: 761,569

[22] Filed: Jan. 24, 1977

[51] Int. Cl.² .................. H01J 7/44; H01J 19/78; H01J 29/96; H01J 17/34

[52] U.S. Cl. ......................... 315/74; 307/308; 339/30; 200/DIG. 1; 328/5

[58] Field of Search ............... 200/DIG. 1; 307/308; 339/30, 31 L; 328/5; 315/74

[56] References Cited

U.S. PATENT DOCUMENTS

| | | | |
|---|---|---|---|
| 2,896,131 | 7/1959 | Schumann | 240/2 S |
| 3,255,380 | 6/1966 | Atkins et al. | 200/DIG. 1 |
| 3,307,071 | 2/1967 | Diamond | 200/DIG. 1 |
| 3,899,713 | 8/1975 | Barkan et al. | 315/205 |
| 3,919,596 | 11/1975 | Bellis | 307/308 |
| 3,992,634 | 11/1976 | Larson | 307/308 |

OTHER PUBLICATIONS

"Touch Module–This New Version Does Many Jobs", by S. Hoberman, Electronics, Popular Science, pp. 124 & 125, Feb. 1973.

Primary Examiner—Saxfield Chatmon, Jr.
Attorney, Agent, or Firm—Beveridge, DeGrandi, Kline & Lunsford

[57] ABSTRACT

A socket for mounting an electrical device such as an ordinary incandescent light bulb and enabling the electrical device to be switched to either its "off" condition or its "on" condition in response to touching the socket housing or any part of the structure electrically connected to the socket housing. All electrical components required to effect this switching of the power to the electrical device are mounted within the socket housing. The socket is usable with alternating current electrical power, and switching of the power to the electrical device occurs only when the voltage is passing through its zero point, thus avoiding current surges and lengthening the life of the light bulb or other controlled electrical device.

30 Claims, 4 Drawing Figures

TOUCH-RESPONSIVE SOCKET

Electric lamps have been developed in which switching of power to the light bulb is accomplished by touching a metallic portion of the lamp base. The electronic circuitry required to control the switching of these lamps conventionally has been mounted within the lamp base. Such touch-sensitive lamps have, therefore, required a lamp base adapted to hold the electronic circuitry, and so it has been impractical to sell the electronic switching components for such touch-sensitive lamps to a person desiring to modify an existing conventional lamp to incorporate the touch-actuation feature.

The present invention is a socket for mounting an electrical device such as an incandescent light bulb and responsive to touching of the socket housing or any structure electrically connected to the socket housing to switch power to the electrical device. In accordance with the present invention, the electrical device to be controlled is mounted within a device-receiving member in a first portion of a socket housing, while circuitry enabling control of electrical power to the device is within a second portion of the socket housing. The control circuitry is electrically coupled to the second portion of the socket housing which is formed of an electrically conductive material. When the electrical device is not receiving power and the second portion of the socket housing is touched, a brief flow of current in the control circuitry triggers a switching device to apply power to the electrical device. When the second portion of the socket housing is touched a second time, another brief flow of current triggers the switching device to terminate application of power to the electrical device. The socket is particularly suited for control of power to an incandescent light bulb such as in a lamp. However, although the following description and the drawings make reference to a light bulb in a lamp, the socket is suitable for controlling power to other electrical loads, particularly by use of an electrical adapter mounted in a light bulb socket and adapted to receive a two-prong electrical plug.

The present invention utilizes integrated circuitry and other miniaturization techniques to enable the entire control circuit to be mounted inside the socket. Accordingly, the socket can be mounted on any lamp base or other structure, permitting ready conversion of an existing lamp to touch-actuated operation. Optimum operation of integrated circuitry occurs at moderate temperatures; e.g., temperatures between about 0° C and about 70° C. Accordingly, the present invention provides a heat-sink for those components which generate heat that otherwise might be disadvantageous.

These and other aspects and advantages of the present invention are more apparent in the following detailed description and claims, particularly when considered in conjunction with the accompanying drawings in which like parts bear like reference numerals. In the drawings:

Figure 1:
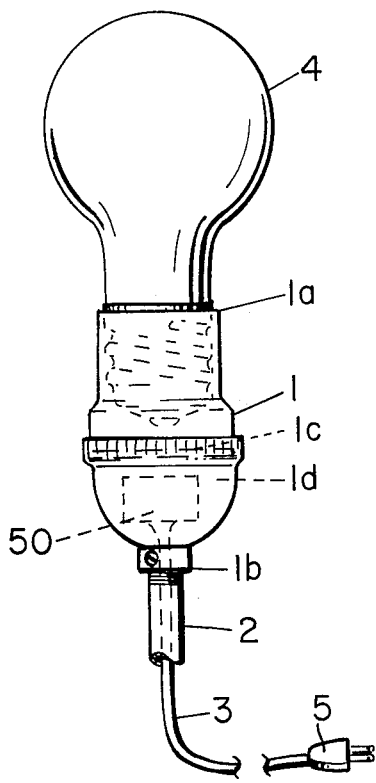
FIG. 1 is a schematic illustration of a touch-responsive socket in accordance with the present invention.
Figure 1A:
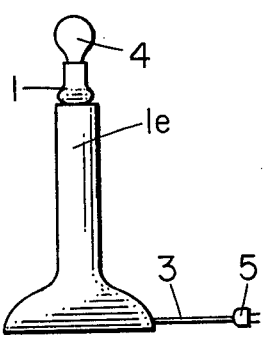
FIG. 1A illustrates a socket in accordance with the present invention mounted on a lamp base.

Socket 1 depicted in FIG. 1 includes an open first end 1a and an open second end 1b. Second end 1b is internally threaded to engage a threaded metal mounting rod 2 through which a power cord 3 passes. Cord 3 is equipped with a plug 5 adapted for plugging into a conventional electrical outlet to provide power to circuitry within socket 1 and to the electrical device controlled by the socket. An electrical device such as light bulb 4 can be inserted into first end 1a of socket 1 to threadedly engage a socket threaded member therein. Control circuitry 50 is positioned within chamber 1d in the lower porion of socket 1. FIG. 1A depicts socket 1 mounted on a metal lamp base 1e by means of mounting rod 2.

Figure 2:
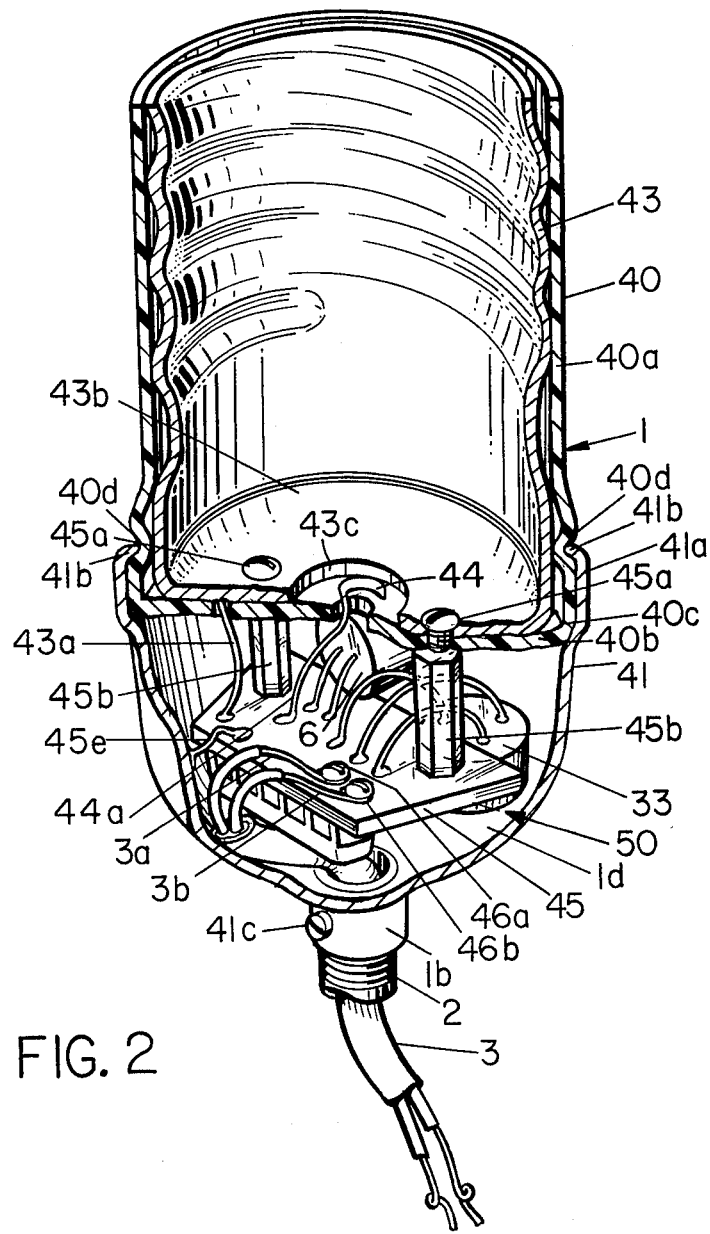
FIG. 2 is an enlarged, partially sectional view of the touch-responsive socket of FIG. 1.

Details of the construction of a preferred embodiment of socket 1 are shown in FIG. 2. First housing portion 40 is formed of an electrically insulating material such as ceramic or plastic and includes cylindrical side wall 40a and a substantially closed end wall 40b. Open end 41a of second housing portion 41 of socket 1 snugly engages the closed end of first housing portion 40, enclosing end wall 40b. If desired, side wall 40a might have a somewhat enlarged end 40c to mate with open end 41a of second housing portion 41. The second end of second housing portion 41 is closed to form internally threaded section 1b which threadedly mates with mounting rod 2 through which power cord 3 passes. A set screw 41c may be provided to lock socket 1 in the preferred position on mounting rod 2, if desired. Second housing portion 41 is formed of an electrically conductive material, for example a thin-walled metal.

A metallic female socket threaded member 43 is provided within first housing portion 40 of socket 1 to threadedly engage an electrical device such as a light bulb. Member 43 includes a radially directed end wall 43b overlying end wall 40b of first housing portion 40. An opening 43c is provided in the center of end wall 43b and metallic contact member 44 is positioned therein, electrically isolated from threaded member 43. Contact member 44 is fastened to ceramic end wall 40b of first housing portion 40.

The electronic circuitry 50 positioned in chamber 1d within lower housing portion 41 includes printed circuit board 45 on which the various miniaturized circuitry components are found. Bolts 45a pass through end wall 43b of socket threaded member 43 and through end wall 40b of first housing portion 40 to threadedly engage spacer blocks 45b within chamber 1d. Printed circuit board 45 is mounted by suitable means to the second end of spacer blocks 45b. Open end 41a of second housing portion 41 includes an inwardly turned lip 41b which engages recess 40d of first housing portion 40 to retain second housing portion 41 coupled on first housing portion 40.

Those components of the control circuitry which are provided in integrated circuit form are mounted on printed circuit board 45. Some components, however, cannot be provided as integrated circuits and are otherwise mounted within chamber 1d. Power leads 3a and 3b within power cord 3 connect to the terminals 46a and 46b on terminal board 45 to provide power to the electronic components. Lead 45e electrically connects second housing portion 41 to circuitry on circuit board 45. Metallic contact member 44 is coupled by lead 44a to circuitry in lower chamber 1d, while socket threaded member 43 is coupled by lead 43a to the circuitry in chamber 1d. Leads 43a and 44a pass through appropriate openings in end wall 40b.

Figure 3:
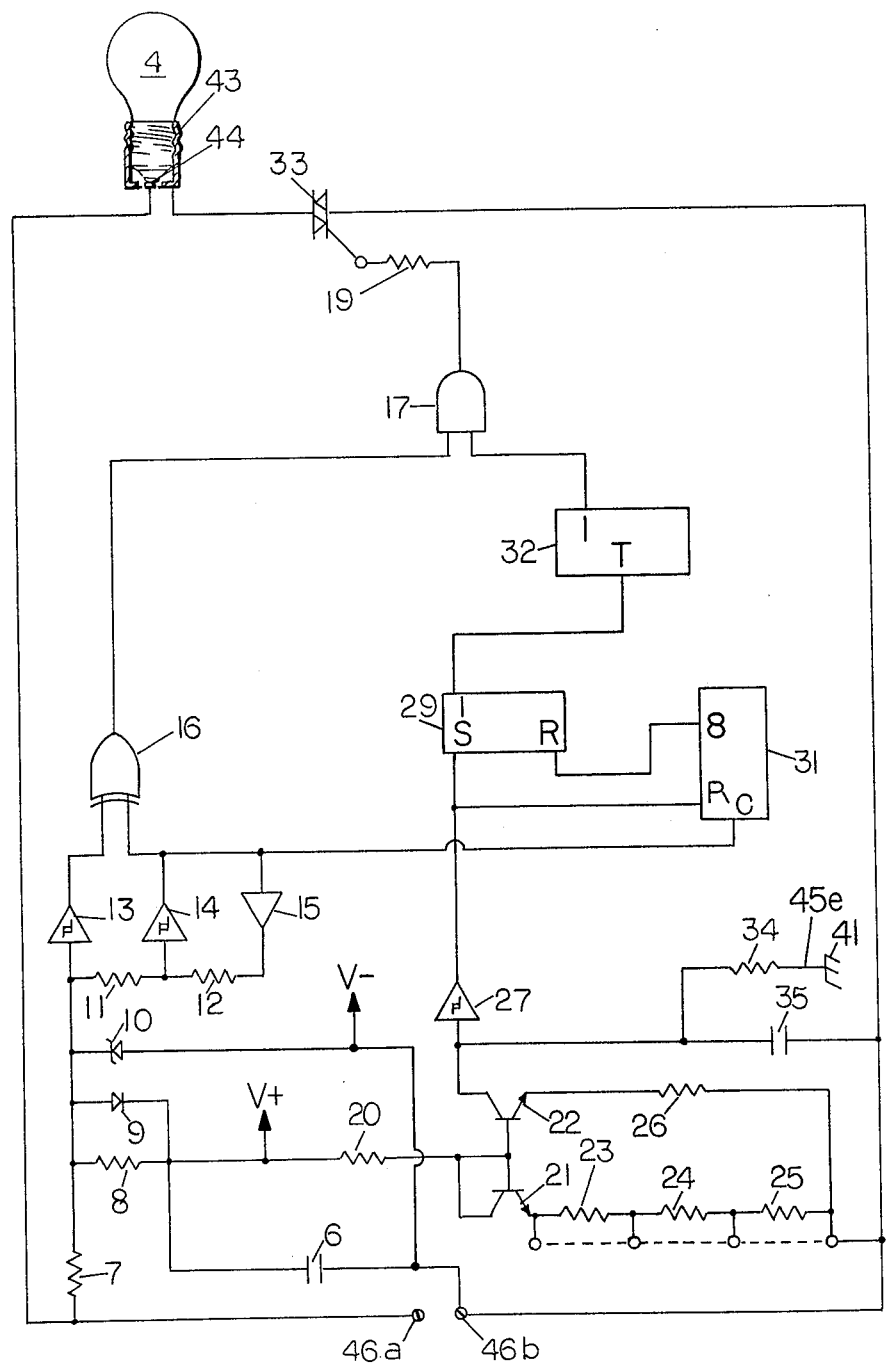
FIG. 3 is a schematic diagram of control circuitry suitable for mounting within the socket of the present invention to enable touch actuation.

FIG. 3 depicts circuitry suitable for the control of power to a load within socket threaded member 43. Power terminal 46a is tied to one end of resistor 7, the second end of which is coupled through resistor 8 to the first plate of capacitor 6. The second plate of capacitor 6 is tied to power terminal 46b. Diode 9 has its anode tied to the junction of resistors 7 and 8 and its cathode tied to the junction of resistor 8 and capacitor 6. Zener diode 10 has its cathode tied to the junction of resistors 7 and 8 and its anode tied to terminal 46b. The cathode of zener diode 10 is also tied to the input of Schmitt trigger 13. Likewise, the cathode of zener diode 10 is coupled through resistor 11 to the input of Schmitt trigger 14. The output of Schmitt trigger 14 is coupled through the series combination of buffer amplifier 15 and resistor 12 to the input of the Schmitt trigger 14. The outputs of Schmitt triggers 13 and 14 are applied as inputs to exclusive OR circuit 16, the output of which is tied to one input of AND gate 17.

Zener diode 10 is selected so that a maximum voltage drop in the order of about 12 volts can exist across it. Thus, the cathode of zener diode 10 can be at most 12 volts positive with respect to power terminal 46b. The voltage at the cathode of zener diode 10 passes through diode 9 to charge capacitor 6. Thus, during those half cycles of the power applied across terminals 46a and 46b when the cathode of zener diode 10 is positive relative to terminal 46b, capacitor 6 charges rapidly. During the opposite half cycles, the impedance of resistor 8 slows the discharge of capacitor 6. Consequently, a relatively constant voltage is available across capacitor 6. A terminal V+ is tied to the junction of resistor 8 and capacitor 9, and a terminal V— is tied to power terminal 46b. Thus, the voltage across capacitor 6 is available at terminals V+ and V— which constitute the power supply terminals for the digital components of the circuitry of FIG. 3. During each cycle of the line voltage applied across terminals 46a and 46b, a relatively constant potential difference in the order of 12 volts exists across terminals V+ and V— for use as this digital power supply voltage.

The output from Schmitt trigger 13 is a series of pulses as the Schmitt trigger is actuated by the alternating line voltage. Likewise, the output from Schmitt trigger 14 is a series of pulses. Because of resistors 11 and 12 and amplifier 15, the pulses in the output of Schmitt trigger 14 are offset in time from the pulses in the output of Schmitt trigger 13. Since these two outputs are applied as inputs to exclusive OR circuit 16, circuit 16 generates a series of relatively brief pulses, there being two pulses from circuit 16 during each cycle of the line voltage applied across terminals 46a and 46b. These pulses occur just after the alternating line voltage has passed through its zero level, during the brief intervals when only one of the two Schmitt trigger circuits 13 and 14 is providing an output.

The junction of capacitor 6 and resistor 8 is coupled through resistor 20 to the base of NPN transistor 21, which has its collector tied to its base. The emitter of transistor 21 is coupled through the series chain of resistor 23, resistor 24, and resistor 25 to power terminal 46b. Jumper terminals are provided at the junction of the emitter of transistor 21 and resistor 23, the junction of resistors 23 and 24, the junction of resistors 24 and 25, and the junction of resistor 25 and power terminal 46b. Accordingly, one or more jumpers may be placed to short out one or more of these resistors.

Resistors 20 also couples the junction of capacitor 6 and resistor 8 to the base of NPN transistor 22, the emitter of which is coupled by resistor 26 to power terminal 46b. The collector of transistor 22 is coupled by capacitor 35 to power terminal 46b and is coupled by resistor 34 to lead 45e which is tied to the metallic lower portion 41 of socket 1, as illustrated in FIG. 2. The collector of transistor 22 is also applied to the input of Schmitt trigger 27, the output of which is connected to the set input of flip-flop 29 and to the reset input of counter 31. The output of Schmitt trigger 14 is connected to the clock input of counter 31. The 8-count output from counter 31 is applied to the reset input of flip-flop 29. The ONE output of flip-flop 29 is connected to the toggle input of flip-flop 32, the ONE output of which is connected to the second input of AND gate 17. There is no connection from the ZERO output of flip-flop 29 or the ZERO output of flip-flop 32. The output of AND gate 17 is coupled through resistor 19 to the gate terminal of gate controlled semiconductor switch or Triac 33.

Power terminal 46a is tied to contact 44 in first housing portion 40 of socket 1. Socket threaded member 43, which serves as the second contact for the electrical device or light bulb 4 in the conventional manner, is coupled through Triac 33 to power terminal 46b so that when Triac 33 conducts, light bulb 4 is energized, and conversely, when Triac 33 is not conducting, light bulb 4 is de-energized.

Preferably, plug 5 is a polarized plug so that power terminal 46a is neutral while power terminal 46b is excited. In the absence of such a polarized plug, the opposite power connections inhibit proper operation of the touch-sensitive circuitry but do not harm any circuitry. A polarized plug eliminates the possibility of an erroneous power connection, however. With terminal 46a neutral and terminal 46b excited, and with no one touching metallic second housing portion 41 of socket 1 or lamp base 1e, there is no current flow through resistor 34 and the collector of transistor 32 is at a voltage below the threshold voltage of Schmitt trigger 27. When someone touches second housing portion 41 or lamp base 1e, a current path to earth ground is provided, and the voltage on the collector of transistor 22 rises to actuate Schmitt trigger 27. The sensitivity of this circuitry is determined by the presence or absence of jumpers across resistors 23, 24 and 25. Maximum sensitivity is obtained when jumpers are placed across all three resistors, and about 2 microamperes current through resistor 34 actuates Schmitt trigger 27 in that condition. Minimum sensitivity is obtained with no jumpers so that resistor 23, resistor 24, and resistor 25 are all in the emitter circuit of transistor 21, and about 7 microamperes current through resistor 34 is required to actuate Schmitt trigger 27 in that condition.

In the initial condition, there is no output signal from either the ONE output of flip-flop 29 or the ONE output of flip-flop 32. Since there is no output from the ONE output of flip-flop 32, the pulses from exclusive OR circuit 16 are blocked at AND gate 17. Consequently, current cannot flow through Triac 33, and light bulb 4 is de-energized. When second housing portion 41 of socket 1 or lamp base 1e is touched, the resulting pulse from Schmitt trigger 27 sets flip-flop 29, and the ONE output of flip-flop 29 toggles flip-flop 32 to apply a signal from its ONE output to AND gate 17. Subsequent pulses from exclusive OR circuit 16 pass through AND gate 17 to the gate terminal of Triac 33.

These pulses occur just after the alternating voltage across power terminals 46a and 46b has passed its zero point. The pulses on the gate of Triac 33 actuate the Triac, and so current can then flow through Triac 33 and light bulb 4, energizing the light bulb. The ONE output from flip-flop 32 continues even after a person is no longer touching either second housing portion 41 or lamp base 1e. Consequently, each half cycle of the power across power terminals 46a and 46b, a pulse is applied to the gate of Triac 33 to retain the Triac in its conductive state so that bulb 4 remains energized.

So long as second housing portion 41 or lamp base 1e is being touched, the output from Schmitt trigger 27 is applied to the reset input of counter 31, retaining the counter in its reset condition. When both second housing portion 41 and lamp base 1e are no longer being touched and the output from Schmitt trigger 27 terminates, subsequent pulses from Schmitt trigger 14 clock counter 31 through its count cycle. When counter 31 reaches its 8 count, a pulse is applied to the reset input of flip-flop 29, terminating its ONE output. Flip-flop 32, however, does not change state at this point. Counter 31 is provided to assure a brief delay between consecutive output pulses from the ONE output of flip-flop 29 so that during the transient condition as a person is just touching second housing portion 41 or lamp base 1e, no more than a single output pulse can be generated at the ONE output of flip-flop 29. Once the touching of second housing portion 41 and lamp base 1e has terminated and counter 31 has reset flip-flop 29, a subsequent touching of second housing portion 41 or lamp base 1e results in another pulse from Schmitt trigger 27 to again set flip-flop 29. The resulting ONE output from flip-flop 29 toggles flip-flop 32, terminating its ONE output, and so pulses from exclusive OR circuit 16 are again blocked at AND gate 17. Consequently, voltage is no longer applied to the gate terminal of Triac 33, and the next time the voltage across power terminals 46a and 46b passes through its zero point, Triac 33 stops conducting, de-energizing light bulb 4.

Preferably, as many of the components of the circuitry of FIG. 3 as possible are provided as integrated circuitry mounted on printed circuit board 45, for example within a single integrated circuit chip.

Those components which cannot conveniently be provided in integrated circuit form or otherwise on printed circuit board 45 are also housed within chamber 1d. Thus, for example, capacitor 6 and Triac 33 can be positioned within chamber 1d and electrically coupled to the circuitry on printed circuit board 45, as depicted in FIG. 2. Triac 33 is attached to second housing portion 41, for example with epoxy resin adhesive, to provide a good thermal coupling between Triac 33 and metallic portion 41. As a consequence, metallic second housing portion 41 provides a heat sink for the heat generated within Triac 33.

In many standard light sockets, the socket first portion, analogous to first housing portion 40, is formed of metal and an insulating sleeve is provided between that portion and the socket threaded member 43. Such construction is undesirable in the socket of the present invention because of possible capacitive coupling between the socket threaded member 43 and the socket first housing portion 40. Consequently, in the present invention, it is preferred that first housing portion 40 be formed of a non-conductive or insulating material such as a plastic or a ceramic material. Preferably, also, power cable 3 is a shielded cable with neutral terminal 46a connected to the inner conductor of the shielded cable and with an insulating covering over the shield braid.

Mounting rod 2 mounts socket 1 on lamp base 1e in a conventional manner. As described above, if a metallic lamp base is utilized, then that metallic lamp base is electrically coupled by mounting rod 2 to second housing portion 41 of socket 1. Consequently, a person desiring to turn on the lamp can do so by touching either lamp base 1e or second housing portion 41 of socket 1. Socket 1, of course, is also usable on a lamp having a non-conductive base, such as a porcelain, ceramic, or wooden base; however, then to actuate the lamp, second housing portion 41 of socket 1 must be touched.

FIG. 3 depicts an illustrative circuit suitable for use in controlling the application of power in response to the touching of socket second housing portion 41. Other circuit configurations might be utilized so long as the circuitry can be housed within chamber 1d. The digital circuitry might be mechanized in various manners. Thus, by way of example, flip-flop 29 might be a pair of cross-coupled NOR gates rather than a conventional Eccles-Jordan circuit. Likewise, negative logic might be utilized, with appropriate inversion and/or voltage polarity modifications, in order to optimize implementation of the logic depicted in FIG. 3. Thus, although the present invention has been described with reference to a preferred embodiment, numerous modifications and rearrangements could be made and still the result would come within the scope of the invention.

What is claimed is:

1. A touch-responsive socket for an electrical device comprising:
   a first housing portion having an open first end and a substantially closed second end;
   an electrically conductive socket member within said first housing portion and adapted to engage an electrical device through said first housing portion open first end to apply electrical power thereto;
   a second housing portion formed of an electrically conductive material and having an open first end, engaging said first housing portion second end to form therewith a substantially enclosed chamber, and a second end adapted to mount said touch-sensitive socket on a base member;
   a touch-responsive circuit within said chamber and electrically coupled to said socket member and to said second housing portion and, when coupled to a source of electrical power, responsive to touching of said second housing portion or an electrically conductive member electrically connected thereto to successively couple and de-couple said socket member to the source of electrical power, said touch-responsive circuit including timing means for inhibiting the responsiveness of said circuit for a preset time following termination of touching of said second housing portion and electrically conducting member; and
   cable means for coupling said touch-sensitive circuit to a source of electrical power.

2. A socket as claimed in claim 1 in which said touch-responsive circuit includes at least one component which generates heat, and means connecting said heat generating component to said second housing portion for enabling said second housing portion to be a heat sink for heat generated by said heat generating component.

3. A socket as claimed in claim 1 in which said cable means comprises a shielded cable.

4. A socket as claimed in claim 1 in which said cable means includes a polarized plug.

5. A socket as claimed in claim 1 in which said first housing portion is formed of an electrically insulating material.

6. A socket as claimed in claim 5 in which said first housing portion is formed of a ceramic material.

7. A socket as claimed in claim 5 in which said first housing portion is formed of a plastic material.

8. A socket as claimed in claim 1 in which said touch-responsive circuit includes integrated circuitry.

9. A socket as claimed in claim 8 in which said integrated circuitry includes a plurality of circuit components on a single chip.

10. A socket as claimed in claim 8 in which said integrated circuitry is mounted on a printed circuit board connected to said first housing portion second end.

11. A socket as claimed in claim 1 in which said socket member comprises a female socket threaded member.

12. A socket as claimed in claim 1 in which said touch-responsive circuit includes sensitivity control means for controlling the sensitivity of the touch-responsiveness of said circuit.

13. A socket as claimed in claim 1 further comprising a lamp base member, with said second housing portion mounted on said lamp base member and said cable means passing through said lamp base member 14. A socket as claimed in claim 13 in which said lamp base member is formed of metal and is electrically connected to said second housing portion.

15. A socket as claimed in claim 14 in which said cable means comprises a shielded cable.

16. A touch-responsive socket for an electrical device comprising:
a first housing portion having an open first end and a substantially closed second end;
an electrically conductive socket member within said first housing portion and adapted to engage an electrical device through said first housing portion open first end to apply electrical power thereto;
a second housing portion formed of an electrically conductive material and having an open first end, engaging said first housing portion second end to form therewith a substantially enclosed chamber, and a second end adapted to mount said touch-sensitive socket on a base member;
cable means adapted for connection to a source of alternating electrical power; and
a touch-responsive circuit within said chamber and electrically coupled to said socket member, to said second housing portion, and to said cable means and, when coupled by said cable means to a source of alternating electrical power, responsive to touching of said second housing portion or an electrically conductive member electrically connected thereto to successively couple and de-couple said socket member to the source of alternating electrical power, with the coupling of said socket member to the source of alternating electrical power being initiated just after the electrical power passes through its zero level.

17. A socket as claimed in claim 16 in which said touch-responsive circuit includes at least one component which generates heat, and means connecting said heat generating component to said second housing portion for enabling said second housing portion to be a heat sink for heat generated by said heat generating component.

18. A socket as claimed in claim 16 in which said cable means comprises a shielded cable.

19. A socket as claimed in claim 16 in which said cable means includes a polarized plug.

20. A socket as claimed in claim 16 in which said first housing portion is formed of an electrically insulating material.

21. A socket as claimed in claim 20 in which said first housing portion is formed of a ceramic material.

22. A socket as claimed in claim 20 in which said first housing portion is formed of a plastic material.

23. A socket as claimed in claim 16 in which said touch-responsive circuit includes integrated circuitry.

24. A socket as claimed in claim 23 in which said integrated circuitry includes a plurality of circuit components on a single chip.

25. A socket as claimed in claim 23 in which said integrated circuitry is mounted on a printed circuit board connected to said first housing portion second end.

26. A socket as claimed in claim 16 in which said socket member comprises a female socket threaded member.

27. A socket as claimed in claim 16 in which said touch-responsive circuit includes sensitivity control means for controlling the sensitivity of the touch-responsiveness of said circuit.

28. A socket as claimed in claim 16 further comprising a lamp base member, with said second housing portion mounted on said lamp base member and said cable means passing through said lamp base member.

29. A socket as claimed in claim 28 in which said lamp base member is formed of metal and is electrically connected to said second housing portion.

30. A socket as claimed in claim 29 in which said cable means comprises a shielded cable.

* * * * *